United States Patent [19]

Mayer et al.

[11] Patent Number: 4,816,893
[45] Date of Patent: Mar. 28, 1989

[54] LOW LEAKAGE CMOS/INSULATOR SUBSTRATE DEVICES AND METHOD OF FORMING THE SAME

[75] Inventors: Donald C. Mayer; Prahalad K. Vasudev, both of Thousand Oaks, Calif.

[73] Assignee: Hughes Aircraft Company, Los Angeles, Calif.

[21] Appl. No.: 166,145

[22] Filed: Mar. 10, 1988

Related U.S. Application Data

[62] Division of Ser. No. 17,498, Feb. 24, 1987, Pat. No. 4,753,895.

[51] Int. Cl.⁴ .............................................. H01L 27/02
[52] U.S. Cl. ........................................ 357/42; 357/91; 357/4
[58] Field of Search ........................ 357/23.7, 42, 91, 4

[56] References Cited

U.S. PATENT DOCUMENTS

4,509,990  4/1985  Vasudev ............................... 357/91
4,659,392  4/1987  Vasudev ............................... 357/91

*Primary Examiner*—Andrew J. James
*Assistant Examiner*—Mark Prenty
*Attorney, Agent, or Firm*—Wanda K. Denson-Low; V. G. Laslo; A. W. Karambelas

[57] ABSTRACT

A method of fabricating CMOS circuit devices on an insulator substrate is disclosed in which a solid phase epitaxy process is applied to islands for the individual devices in the same step as the channel dopant implants. An ion species, preferably silicon for a silicon island, is implanted into each island at an energy and dosage sufficient to amorphize a buried layer of the island in the vicinity of an underlying insulated substrate; silicon-on-sapphire (SOS) is preferably employed. The buried layers are then recrystallized, using the unamorphized portions of the semiconducotr islands as crystallization seeds. Islands of generally uniform, high quality semiconductor material are thus obtained which utilize dopant implants more efficiently, and avoid prior parasitic transistors and leakage currents. By implanting the ion species to a greater depth than the nominal island thickness for n-channel devices, and to a lesser depth than the nominal island thickness for p-channel devices, back channel current leakage is reduced while undesirable aluminum auto doping is avoided for the p-channel devices.

17 Claims, 4 Drawing Sheets

LOW LEAKAGE CMOS/INSULATOR SUBSTRATE DEVICES AND METHOD OF FORMING THE SAME

CROSS REFERENCE TO RELATED APPLICATION

This application is a divisional application of parent Ser. No. 07/017,498, filed on Feb. 24, 1987 by Mayer et al (PD-85293), and issued to Mayer et al as U.S. Pat. No. 4,753,895, which parent application is incorporated by reference herein. Each of the applications is copending and commonly assigned.

BACKGROUND OF THE INVENTION

1. Field of the Invention

This invention relates to the fabrication of complementary metal-oxide-semiconductor (CMOS) circuit structures on an insulator substrate, such as silicon-on-sapphire (SOS), and more particularly to a process for forming devices such as field effect transistors (FETs) having a highly controlled defect density profile in the channel region.

2. Description of the Related Art

The advantages of utilizing a composite substrate comprised of a monocrystalline semiconductor layer, such as silicon, epitaxially deposited on a supporting insulated substrate are well recognized. These advantages include a substantial reduction in parasitic capacitance between charged active regions, and the effective elimination of leakage currents flowing between adjacent active devices. This is accomplished by employing as the substrate an insulative material with a high dielectric constant, such as sapphire ($Al_2O_3$), and providing that the conduction path of any interdevice leakage current must pass through the substrate.

In a typical prior fabrication technique for an FET, a thin undoped silicon layer was deposited on top of a sapphire substrate and etched into separate islands, or mesas. The islands intended for p-channel devices were then covered with a photoresist while a p-type dopant such as boron was implanted into the islands for the n-channel devices; the process was then reversed, with the n-channel devices covered with a photoresist while the p-channel islands were implanted with an n-type dopant such as phosphorus or arsenic. The photoresist was then removed, oxide and metallic (or polysilicon) layers deposited over the gate area, source and drain areas implanted, and gate, source and drain contacts formed on the islands.

The dopant implant has generally been performed with an ion implanter. The implant is activated by a high temperature anneal, such as 900° C. for 20–30 minutes, which also reduces the damage caused by the implant. The nature of the dopant implant influences at least three of the ultimate device parameters: it establishes the threshold voltage for turning on the FET; it determines the punchthrough voltage for short channel transistors, and it controls the leakage current through the transistor along its back gate interface with the sapphire substrate.

With conventional SOS techniques, the crystalline quality of the silicon near the sapphire substrate is usually not as good as it is farther from the sapphire, and contains a significantly higher concentration of lattice defects. This results from the fact that, although the lattice spacings of silicon and sapphire are similar, they are not identical. This causes an undesirably high concentration of defects when the silicon is grown over the sapphire. As a result, the dopant implants in the defect area are not activated as efficiently, and a greater concentration of dopant has to be implanted to obtain the same level of electrically active atoms than with higher quality silicon. Another distinct problem associated with conventional CMOS/SOS devices is a tendency toward leakage current between the source and drain along the edges of the island near the sapphire substrate because of the higher defect concentration in that area. This creates a parasitic transistor which has a lower threshold voltage than desired, and turns on before the gate voltage has reached the designed threshold level; this problem is particularly acute for n-channel devices. Back gate leakage current across the silicon-sapphire interface is also a problem.

The back gate and edge leakage currents described above tend to increase during irradiation, and are a major cause of CMOS/SOS circuit failure in radiative environments. Even if the device operates satisfactorily in a normal environment, it would be desirable to make it more "radiation hard".

A technique for significantly reducing the semiconductor lattice defect concentration near the insulator substrate is described in U.S. Pat. No. 4,509,990 by Prahalad K. Vasudev, issued Apr. 9, 1985 to Hughes Aircraft Company, the assignee of the present invention. This patent discloses a "solid phase epitaxy" method for improving the quality of the semiconductor layer throughout an entire wafer, particularly near its interface with an insulator substrate. Prior to the formation of individual circuit devices, an ion species is implanted into the semiconductor layer along the entire wafer at an implant energy and dosage which is sufficient to amorphize a buried layer portion of the semiconductor to a depth near the insulator substrate. The amorphous buried layer is then regrown by a high temperature anneal so as to recrystallize the buried layer, using the overlying unamorphized portion of the semiconductor layer as a crystallization seed. In this manner the semiconductor lattice structure is made more homogeneous throughout. The semiconductor layer is then etched into separate islands, and circuit devices are formed using conventional techniques.

This solid phase epitaxy technique can provide consistently good circuit structures if the thickness of the semiconductor layer is perfectly uniform and known. Unfortunately, with present deposition techniques random variations occur in the thickness of the semiconductor film at different locations on the wafer. Thus, for a constant ion species implant designed to create a buried amorphous layer which extends down to the nominal (target) thickness of the semiconductor film, the implanted ions will not amorphize the semiconductor all the way down to the substrate wherever the semiconductor layer is thicker than nominal, leaving a film of defective semiconductor near the underlying insulator substrate. On the other hand, with an SOS structure using an amorphizing silicon implant, if the silicon layer is thinner than nominal a substantial portion of the implanted silicon ions will travel into the sapphire, causing a release of aluminum from the sapphire back into the silicon. While this is not a major drawback for n-channel devices, the aluminum "auto doping" is a significant problem for p-channel devices. It negates the doping of the p-channel devices, and also increases the severity of back channel leakage.

The former solution to this problem has been to avoid implanting the silicon ions to the full nominal thickness of the silicon layer. While this reduces the problem of aluminum auto doping for p-channel devices, it may leave more residual lattice defects in the silicon near the sapphire substrate. Thus, in order to overcome the increase in back channel current, some of the original benefits of the solid phase epitaxy technique may have been traded off.

SUMMARY OF THE INVENTION

In view of the above problems, the purpose of the present invention is to provide a method of fabricating CMOS circuit structures on an insulator substrate, and an associated circuit structure, which achieves the dopant activation efficiency of an ideal solid phase epitaxy process, avoids excessive back gate leakage current and low threshold voltage parasitic transistors, does not significantly increase processing time or expense, and is radiation hard.

These goals are accomplished by performing a solid phase epitaxy operation on the individual islands in connection with the dopant implantation steps for the islands, as opposed to the prior solid phase epitaxy step performed on the entire wafer before its semiconductor layer is divided into separate islands. Separate ion species implants are performed for the n- and p-channel devices. The p-type and n-type dopant implants for the same islands are performed either before or after the ion species implants. The preferred technique is to perform the ion species implant before the dopant implant, to avoid "channeling tails" in the dopant distribution profile. Following the dopant and ion species implants, the amorphous buried layers formed by the ion species implants are regrown to form recrystallized buried layers using the unamorphized portions of the semiconductor islands as crystallization seeds in a first, relatively low temperature anneal. The dopants are then activated by a high temperature anneal. In the example of FETs, the devices are completed by forming insulative and conductive gate layers, and performing source and drain implants.

For a given nominal thickness of the semiconductor layer, the ion species is preferably implanted deeper than the nominal island thickness for the n-channel islands, and to a lesser depth than the nominal island thickness for the p-channel islands. This avoids the problem of aluminum auto doping, discussed above, for the p-channel devices. However, it permits the removal of lattice defects through the entire depth of the semiconductor island for the n-channel devices by implanting the ion species down into the underlying substrate. The aluminum auto doping problem is not significant for n-channel devices, which are typically doped with boron; the release of aluminum into the semiconductor merely increases the n-channel doping level. It can be compensated if desired by reducing the boron doping level. However, since the aluminum auto doping is localized near the substrate/semiconductor interface, it reduces the back channel leakage current and is thus normally desirable, without a reduction in boron doping. If desired, a preliminary solid phase epitaxy step can be performed on the entire wafer prior to dividing the semiconductor layer into separate islands.

These and other advantages of the invention will be apparent to those skilled in the art from the following detailed description of the preferred embodiments, taken together with the accompanying drawings, in which:

DETAILED DESCRIPTION OF PREFERRED EMBODIMENTS

Figure 1:
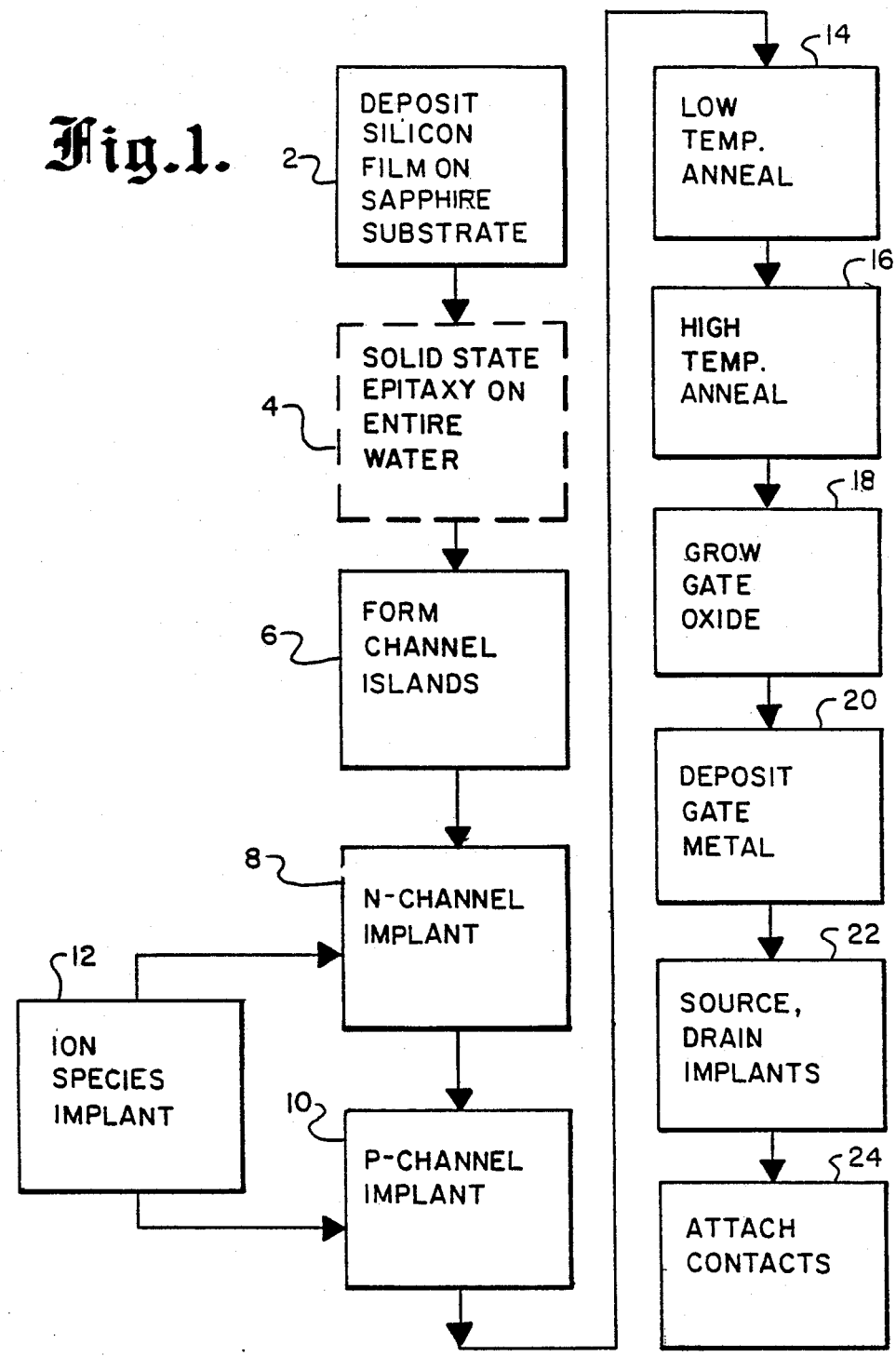
FIG. 1 is a flow diagram showing the sequence of steps in the invention.

FIG. 1 is a flow diagram illustrating the basic steps of the present invention in providing monocrystalline semiconductor islands on the surface of an insulator substrate, and thereby forming a composite structure that is highly desirable for use in the fabrication of high-o speed integrated circuits. The process is adaptable to a wide variety of semiconductor and insulator materials. See, U.S. Pat. No. 3,393,088 (silicon on alpha-aluminum oxide); U.S. Pat. No. 3,414,434 (silicon on spinel insulators); U.S. Pat. No. 3,475,209 (silicon on chrysoberyl); and U.S. Pat. No. 3,664,866 (IId-VIa semiconductor compounds on insulator substrates). For the purpose of simplicity in the following discussion, essentially intrinsic silicon will be used as an exemplary semiconductor material and sapphire ($Al_2O_3$) will be used as an exemplary insulator material. Accordingly, the specific embodiments described below are only representative of various combinations of material with which the present invention can be practiced.

In the exemplary process, a silicon layer is first epitaxially deposited upon a sapphire substrate. Procedures for preparing the substrate and for performing the epitaxial deposition are known in the art. For example, see U.S. Pat. No. 3,508,962, U.S. Pat. No. 3,546,036, and J. C. Bean et al. "Substrate And Doping Effects Upon Laser-Induced Epitaxy Of Amorphous Silicon", *Journal of Applied Physics*, Vol. 50, No. 2, pp. 881–885, February 1979. The sapphire substrate is preferably on the order of 10–13 mils in thickness. Desirable crystal orientations are discussed in U.S. Pat. No. 4,509,990.

The epitaxial silicon layer is preferably deposited on the surface of the sapphire by a chemical vapor deposition (CVD) step. The CVD growth of the epitaxial layer is preferably performed by the chemical decomposition of silane ($SiH_4$) in an appropriate reactor at approximately 910° C. The epitaxial growth is controlled so as to achieve a silicon epitaxial layer preferably between 0.1–0.3 microns in thickness within a growth range of approximately 0.3–2.4 microns/min., preferably at a rate of 2.4 microns/min. The minimum film thickness must be sufficient to provide a continuous silicon film having a substantially uniform surface so as to facilitate further processing of the structure. A suitable silicon/sapphire structure is commercially available from the Crystal Products Division of Union Carbide Inc., San Diego, Calif.

After the silicon film has been deposited on the substrate, a solid phase epitaxy treatment of the entire wafer, as taught in U.S. Pat. No. 4,509,990, may be performed as an optional step 4. In certain cases this optional step may improve the homogeneity of the silicon islands in the ultimate circuit structure, but it adds a separate processing step which increases the time and cost of the circuit fabrication.

When the silicon film is ready, it is formed into separate islands in step 6 by well known etching techniques. Each island will ultimately bear an FET or other circuit device. The islands are separated from each other by the insulator substrate, which prevents leakage between adjacent islands.

The next step in the fabrication process is the channel implant step. While the order of implantation is not important, in the illustrative embodiment the p-channel devices are first covered with a resist material, such as photoresist or E-beam resist, while the n-channel devices are implanted with a p-type dopant in step 8. The n-channel devices are then covered with photoresist and openings are formed over the p-channel devices, which are implanted with an n-type dopant in step 10. The typical p-type dopant is boron, while phosphorus or arsenic is typically used as the n-type dopant. The doping techniques are well known.

In accordance with the invention, the islands are treated with a solid phase epitaxy process in step 12 as part of the channel implant step. This is accomplished separately for the n-channel and p-channel islands. An ion species is implanted into the islands either before or after their respective dopant implants. As discussed below, a differential implant of the ion species for the n- and p-channel islands, with each type of island implanted with the ion species to a different depth during the same step as the dopant implant while the other type of island is covered with photoresist, offers unique advantages.

The ion species is implanted through the exposed surfaces of the island layers so as to create a buried amorphous silicon layer in each island, covered by a substantially crystalline silicon layer. For a silicon epitaxial layer, the preferred ion species is also silicon to prevent the surface crystalline silicon layer from being contaminated. Other ion species, preferably inert species such as argon and neon, might also be used. Performing the ion species implant in the same fabrication step as the dopant channel implants does not add appreciably to the required fabrication time, and thus can be accomplished with little additional cost.

At the completion of the channel implant step, each island has an amorphous buried layer in the vicinity of the sapphire substrate in which the lattice defects originally present have been eliminated. The silicon lattice structure is then regrown through the amorphous buried layers from the top down, using the upper unamorphized portions of the islands as crystallization seeds, in a low temperature anneal step 14. Since the crystalline structure in the upper portion of the islands does not have nearly the defect density as the original crystal structure adjacent to the sapphire substrate, regrowing the buried layers using the upper portions of the islands as seeds results in a regrown buried layer with a greatly reduced defect density. The low temperature anneal can take place over a range of about 500°–900° C., but a temperature of about 600° C. is preferred. The recrystallization time increases exponentially for lower temperatures, while substantially higher temperatures can result in a recrystallization rate that is too fast and incurs additional crystal defects. The recrystallization anneal requires from about 30 minutes to about 3 hours.

Once recrystallization is complete, the implanted channel dopants are activated in a higher temperature anneal step 16 at a temperature within the approximate range of 850°–1100° C. This may be either a conventional furnace anneal that typically lasts for about 20–30 minutes, or a rapid thermal anneal, such as may be obtained in a flashlamp system.

Once the formation and enhancement of the islands has been completed as described, the FETs are finished in the conventional manner. This consists of the growth of insulative gate oxide ($SiO_2$) layers 18 over the gate portions of the islands, the deposit of conductive metallic (or polysilicon) layers 20 over the respective gate oxide layers, the performance of source and drain implants 22, and the attachment of appropriate contacts 24 to the gate, source and drain of each FET.

Figure 2:
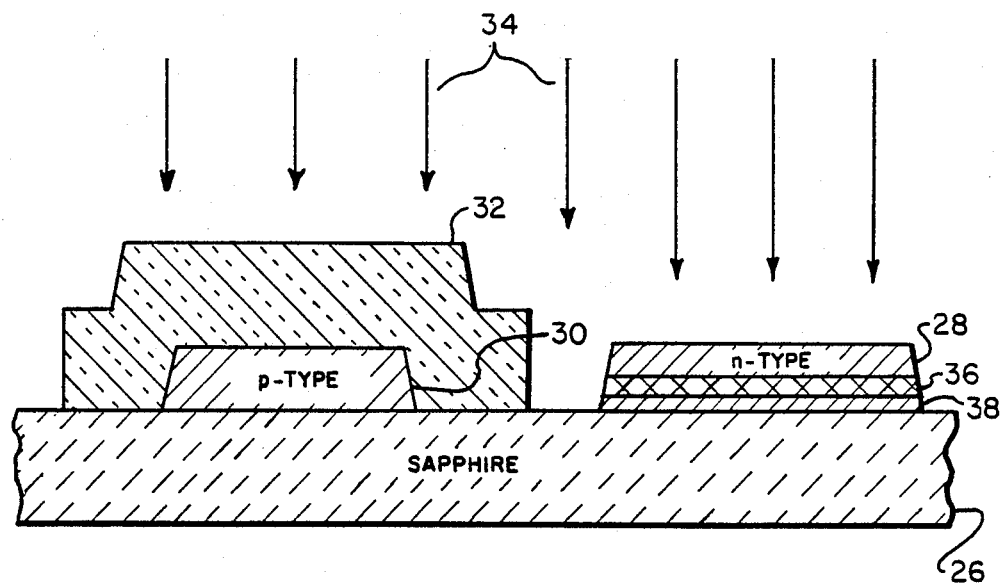
FIGS. 2 and 3 are fragmentary sectional views illustrating the implant of an ion species into p-channel and n-channel devices, respectively.
Figure 3:
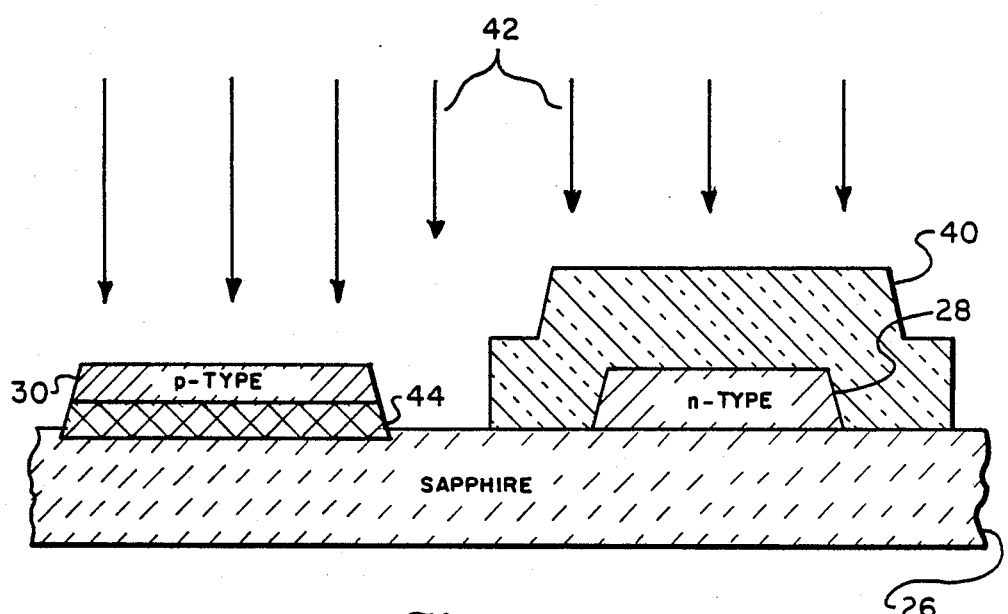

FIGS. 2 and 3 illustrate an important aspect of the invention, which is the achievement of differentiated buried layers for p-channel and n-channel devices. In FIG. 2, a sapphire substrate 26 is shown surmounted by a first silicon island 28 which has been implanted with an n-type dopant to furnish a base for a p-channel FET, and by a second silicon island 30 which has been implanted with a p-type dopant to provide a base for an n-channel FET. The p-type island 30 is covered by a layer of photoresist 32, while photoresist has been removed from over n-type island 28 by conventional mask-etching techniques to expose the island. An ion species, preferably silicon, is then directed onto the wafer as indicated by arrows 34. The ion species is implanted into the exposed n-type island 28, while the p-type island 30 is protected by the photoresist and does not receive the implant. The energy and density of the implanted silicon ions are selected such that the ions are implanted to a depth which establishes a buried amorphous layer 36 in the vicinity of, but slightly spaced above, the sapphire substrate. By thus selecting a conservative implant depth, normal variations in the thickness of the silicon layer can be accommodated without aluminum "auto doping" from the sapphire substrate.

The ion implant energy and dosage is selected so that the product of the residual energy and dosage of those ions which pass into the insulator substrate is less than the damage density threshold of the substrate, despite normal thickness variations in the silicon layer 28. For islands whose thickness is roughly equal to or greater than the nominal silicon layer thickness, the result will be a thin layer 38 of silicon immediately adjacent to the sapphire substrate that has not been amorphized and regrown, and retains its original lattice defects. However, this defective layer 38 will be thinner than the original defective layer prior to the solid phase epitaxy treatment, and accordingly some improvement in device fabrication is achieved. This is essentially the approach taken in U.S. Pat. No. 4,509,990 for the entire wafer.

In FIG. 3 the treated n-type island 28 has been coated with a layer of photoresist 40, while the photoresist layer 32 over p-type island 30 has been removed to expose the island to a radiation by another beam of silicon ions 42. These ions have a greater energy and density than the ion beam used to implant the n-type channel 28, and the buried amorphized layer 44 accordingly extends right up to the interface with the sapphire substrate; the lattice structure of the substrate itself is damaged to a certain extent. The advantage of the greater implant depth is that an essentially complete amorphization of the entire defective island section is assured, permitting the amophized section to then be regrown into high quality silicon right down to the sapphire substrate. While aluminum "auto doping" results from the ion implant into the sapphire, releasing aluminum ions into the silicon island, aluminum is in the same column of the periodic table as the boron dopant, and the "auto doping" merely serves to increase the doping level effected by the boron implant. If desired, this increase in doping level can be compensated by reducing the amount of the boron implant. However, the increase in doping level is localized near the silicon/sapphire interface, and has the effect of reducing back channel leakage current between the source and drain of the completed n-channel transistor. This is highly desirable, and accordingly the original level of boron doping need not be changed.

All of the p-channel devices on the substrate can be implanted with the ion species at the same time to a lesser depth, while all of the n-channel devices on the substrate can be treated together at the same time to a greater depth. Thus, complementary pairs of FETs can be formed for a wide variety of CMOS applications.

Figure 4:
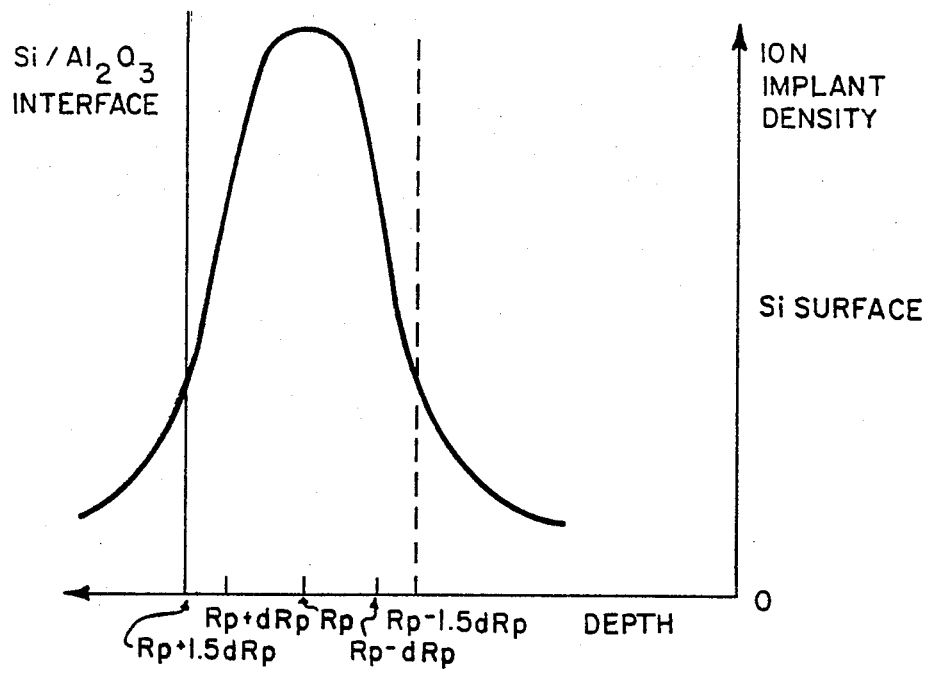
FIG. 4 is a graph showing the ion implant density for a solid phase epitaxy performed at a slightly lesser depth than the depth of the semiconductor layer.

The density of the ion species implant generally exhibits a Gaussian distribution with respect to the depth into the silicon island. FIG. 4 illustrates the ion implant density distribution for a p-channel device, in which the implant is centered slightly above the silicon sapphire interface. The statistical distribution of the implanted ions exhibits a central maximum at a distance $R_p$ beneath the exposed surface of the silicon island 28. Both $R_p$ and the standard deviation of the distribution of implanted ions about $R_p$, $dR_p$, are dependent upon the semiconductor material type and the ion species implanted. $R_p$ and $dR_p$ are also directly proportional to the ion implanted energy, both increasing with corresponding increases in the implant energy. For silicon ions implanted at various energies into a silicon material, as well as many other combinations of common ion species and semiconductor materials, the values of $R_p$ and $dR_p$ have been determined and tabulated. See, J. F. Gibbons, W. F. Johnson, S. W. Myloroie, *Projected Range Statistics*, 2 ed. Halstead Press, Stroudfburg 1975.

The maximum disruption of the silicon crystal lattice structure naturally occurs at $R_p$, since there is a maximum concentration of implanted ions at that depth. However, a sufficient number of ions must be implanted to disrupt, and thereby amorphize, a portion of the silicon layer 36 (FIG. 2) which is substantially symmetrically distributed around $R_p$. The width of the amorphized layer is substantially dependent upon, and increases with, corresponding increases in the ion dose when implanted at a given implant energy. Increases in the implant energy widen the implanted distribution of the ions, thereby requiring higher ion doses to maintain or increase the width of the amorphized layer.

The implantation energy and the ion dose of a given ion species are selected so that a substantially, if not completely amorphorous layer is created about $R_p$, extending from approximately $R_p$ minus 1.5 $dR_p$ to $R_p$ plus 1.5 $dR_p$. Implantation energies and ion doses necessary to achieve an amorphous layer 36 width of up to and exceeding approximately 3 $dR_p$ are readily obtainable. For the amorphous layer 36 in the p-channel devices to lie slightly above the sapphire substrate, the nominal thickness of the initial crystalline silicon island 28 should be slightly greater than $R_p$ plus 1.5 $dR_p$. The implantation energy and the ion dose are constrained for the p-channel devices such that they do not exceed the damage density threshold of the sapphire substrate, which is defined herein as the dose of ions penetrating the surface of the crystal times the average energy of the penetrating ions. The damage density threshold for any crystalline insulator material can be calculated as discussed, for example by M. W. Thompson, in "Defects And Radiation Damage In Metals", Cambridge University Press, Cambridge, Mass., 1969.

Figure 5:
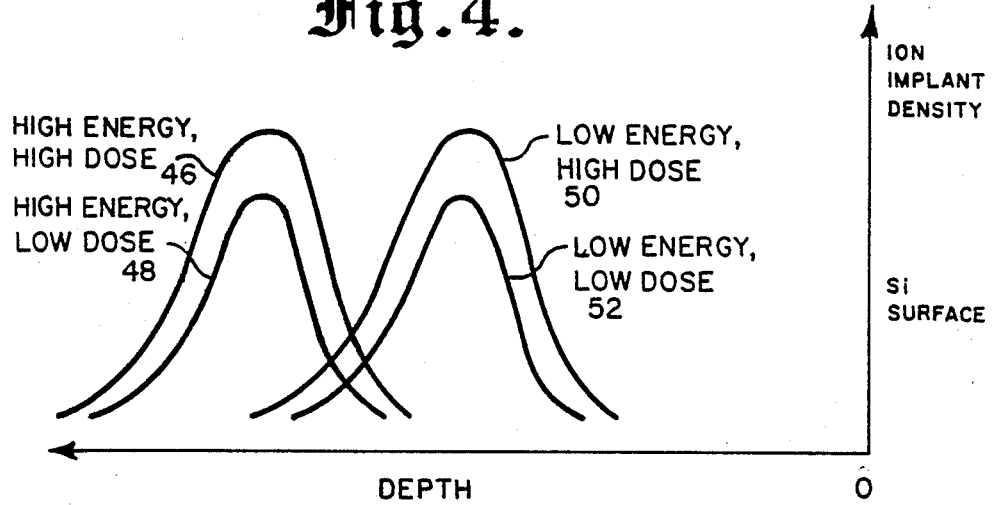
FIG. 5 is a graph illustrating the effects of implant energy and dosage on the ion species implants.

FIG. 5 illustrates the effects of differing ion energies and doses on the implant depth. As indicated, a high energy, high dose implant 46 will achieve the same average depth but a wider range than a high energy, low dose implant 48. A low energy, high dose implant 50 will achieve a lesser average depth than the high energy implants, while a low energy, low does implant 52 will have the same average implant depth but a narrower range than the low energy, high dose implant 50. These characteristics are utilized in selecting the implant specifications for the p- and n-channel devices.

In a particular trial, silicon islands with a nominal thickness of 0.3 microns were formed on a sapphire substrate. The p-channel islands were implanted with silicon ions at 150 KeV and $1.1 \times 10^{15}$ ions/cm$_2$, while the n-channel devices were implanted with silicon ions at 200 KeV and $1.5 \times 10^{15}$ ion/cm$^2$. While in general the advantages discussed above were observed, in some cases a slight increase in the back channel leakage occurred for the p-channel devices, indicating the desirability of an implant energy less than 150 KeV.

Figure 6:
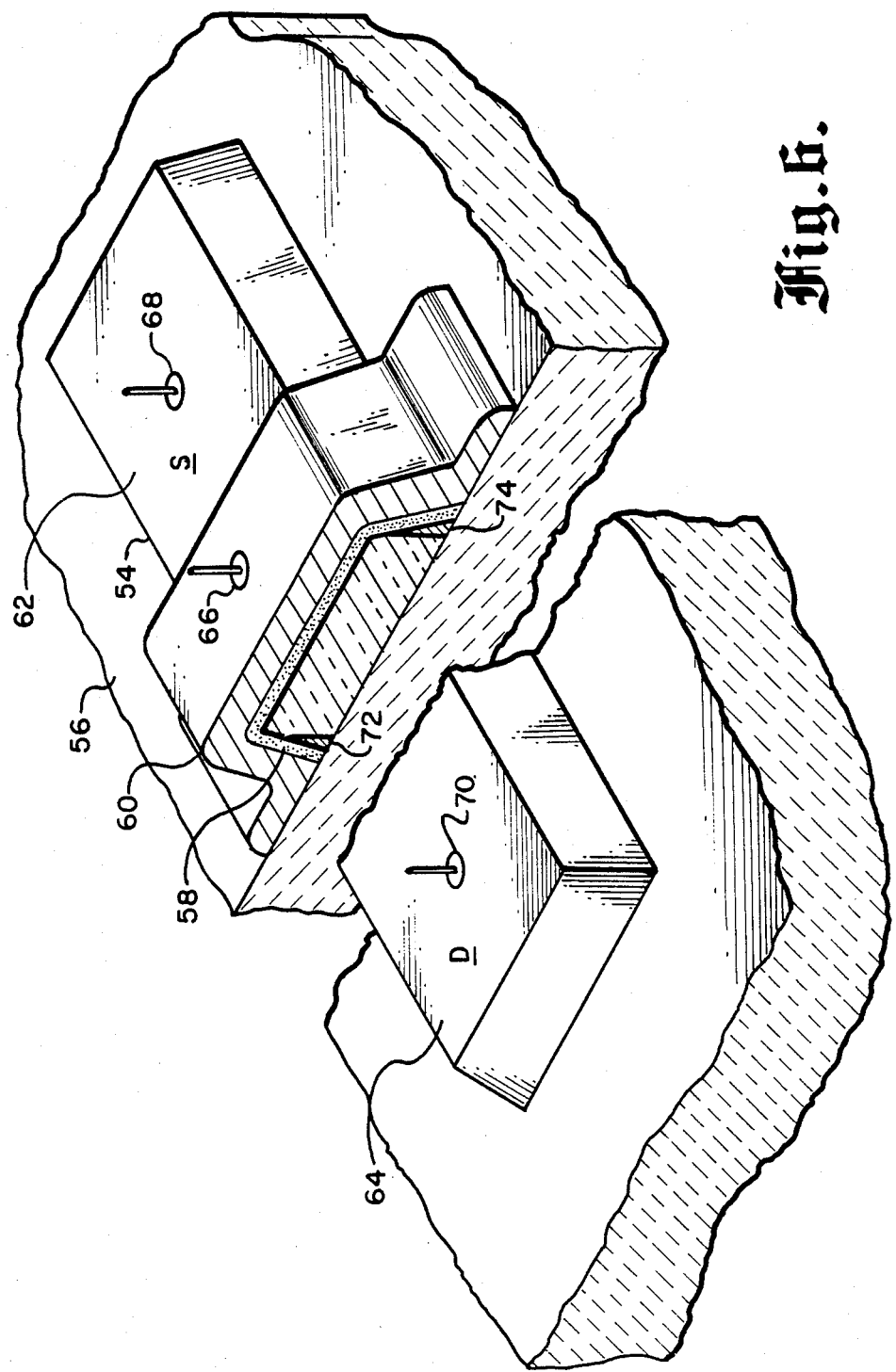
FIG. 6 is a sectioned view in perspective of an FET, illustrating the parasitic transistor condition overcome by the present invention.

An entire FET formed in accordance with the invention is shown in the cut-away perspective view of FIG. 6. A silicon island 54 is formed on a sapphire substrate 56. An oxide layer (SiO$_2$) 58 is formed over the top and sides of the island, the central portion of which forms the gate, with a conductive metal (or polysilicon) layer 60 overlying the oxide layer; both the conductive and oxide layers are formed by conventional techniques. A source/drain implant is performed, after which one side of the island 62 acts as the source, while the opposite side of the island 64 acts as the drain. Gate, source, and drain contacts are provided as indicated at 66, 68 and 70, respectively.

One of the advantages of the invention is the effective threshold control of a parasitic transistor that exists for devices in which the silicon lattice structure is defective near the sapphire substrate. These defective regions result in a lower threshold voltage, permitting a parasitic transistor to turn on at a lower voltage than desired for the FET. Transistor conduction normally takes place along the interface between the gate oxide 58 and silicon island, both along the top of the island and across its sides. With prior devices, there are fewer active dopant ions in the vicinity of the substrate because of the poor silicon crystal structure in that area. This results in the bottom portions of the island sidewalls having a lower threshold voltage than along the remainder of the oxide/silicon interface, and permits current to flow at a lower gate voltage than that for which the device is designed. The undesired current flow occurs along each sidewall in the cross-hatched areas designated 72 and 74; the effective threshold voltage decreases with increasing depth into the island as the sapphire substrate is approached. Thus, a parasitic transistor is created which turns "on" before the desired threshold voltage is reached. This problem is effectively solved by making the silicon crystal structure uniform throughout the island with the present invention. The increased dopant activation achieved with the invention causes a positive threshold voltage shift for the parasitic sidewall n-channel transistor, and a similarly favorable negative threshold voltage shift for the p-channel device. The parasitic transistor problem has been particularly acute for n-channel devices; as discussed above, the present invention achieves the greatest degree of lattice uniformity for n-channel devices.

The reduction in defect concentration achieved with the invention reduces leakage currents in both n- and p-channel channel devices by eliminating generation-recombination centers and increasing minority carrier lifetime in the transistor pn junction depletion regions. Furthermore, the increased dopant activation efficiency counteracts any fixed charges that may exist at the silicon/sapphire interface, and prevents inversion leakage along the back channel in both n- and p-channel transistors.

An improved method of fabricating CMOS-type FETs with differentiated n- and p-channel devices has thus been shown and described. Numerous variations and alternate embodiments may be made in light of the above description of preferred embodiments. For example, while a silicon ion species has been mentioned in connection with silicon islands, an arsenic ion species could be employed for gallium arsenide (GaAs) devices. In general, the ion species is of the same element or an elemental component of the semiconductor. Also, while the invention has been described with reference to an enhancement FET, it is equally applicable to depletion-type devices. In addition, the material improvement technique described here may be applied with minor modifications to the fabrication of complementary MESFETs, JFETs, bipolar transistors, or other semiconductor devices, as well as to MOS transistors. The specific semiconductor and insulator materials used, the specific conductivity type of the semiconductor layer, the specific ion species, ion dose and implantation energy, and the processing times and temperatures employed could all be modified within the limits disclosed. Furthermore, the specific conventional and well-known processing steps, including the preparation of the various materials, the epitaxial deposition of the semiconductor material onto the insulator and the formation of sources, drains, oxide and polysilicon layers have not been described in detail so as not to obscure the present invention. Accordingly, it should be understood that the invention is limited only in terms of the appended claims.

We claim:

1. A complementary metal-oxide semiconductor (CMOS) circuit structure, comprising:
   an insulator substrate,
   a P-type semiconductor island formed on said substrate, said island including a buried layer formed in said island in the vicinity of said substrate and a top surface having an N-type channel FET formed therein,
   an N-type semiconductor island formed on said substrate including a buried layer formed in said island in the vicinity of said substrate and a top surface having a P-type channel FET formed therein, said buried layer formed in said P-type island in the vicinity of said substrate being deeper than said buried layer formed in said N-type island in the vicinity of said substrate.

2. The CMOS circuit structure of claim 1, wherein the islands have a common nominal thickness, the recrystallized buried layers for the n-channel FETs are deeper than said nominal thickness, and the recrystallized buried layers for the p-channel FETs are less deep than said nominal thickness.

3. The CMOS circuit structure of claim 2, wherein the insulator substrate is formed from sapphire and the n-channel FETs are doped with boron.

4. The CMOS circuit structure of claim 1, wherein the recrystallized buried layer for each FET is produced by an annealed implant on an ion species.

5. The CMOS circuit structure of claim 4, wherein said ion species is of the same element or an elemental component of said semiconductor.

6. The CMOS circuit structure of claim 5, wherein said semiconductor and said ion species are silicon.

7. The CMOS circuit structure of claim 5, wherein said semiconductor is GaAs and said ion species is arsenic.

8. A base structure for a pair of N-channel and P-channel semiconductor circuit devices comprising:
   an insulator substrate,
   an activated P-type semiconductor island including a recrystallized buried layer in the vicinity of said substrate,
   an activated N-type semiconductor island including a recrystallized buried layer in the vicinity of said substrate, said buried layer in said P-type island in the vicinity of said substrate being deeper than said buried layer formed in said N-type semiconductor island in the vicinity of said substrate.

9. The base structure of claim 8, wherein the islands have a common nominal thickness, the recrystallized buried layer for the n-channel device is deeper than said nominal thickness, and the recrystallized buried layer for the p-channel device is less deep than said nominal thickness.

10. The base structure of claim 9, wherein the insulator substrate is formed from sapphire and the n-channel island is are doped with boron.

11. The base structure of claim 8, wherein the recrystallized buried layer for each device is produced by an annealed implant of an ion species.

12. The base structure of claim 11, wherein said ion species is of the same element or an elemental component of said semiconductor.

13. The base structure of claim 12, wherein said semiconductor and said ion species are silicon.

14. The base structure of claim 12, wherein said semiconductor is GaAs and said ion species is arsenic.

15. A semiconductor device comprising:
   an insulator substrate,
   a first semiconductor island of a first conductivity type formed on said substrate, said first semiconductor island having a recrystallized buried layer in the vicinity of said substrate, and
   a second semiconductor island of a second conductivity type opposite said first conductivity type formed on said substrate, said second semiconductor island having a recrystallized buried layer in the vicinity of said substrate elevationally disparate to said buried layer of said first island with respect to said substrate.

16. The device of claim 15 wherein each of said first semiconductor island and said second semiconductor island has an upper surface, at least one side surface extending between said upper surface and said substrate, and device regions adjacent said upper surface and said side surface between which conduction occurs upon application of a voltage exceeding a threshold voltage, and wherein said buried layer in each of said first semiconductor island and said second semiconductor island extends to the respective one of each said side surface to enhance control of said threshold voltage on each said side surface relative to said upper surface.

17. The device of claim 15 wherein each of said first semiconductor island and said second semiconductor island has an upper surface and device regions adjacent said upper surface and extending towards the respective said buried layer, said buried layer enhancing control of leakage currents between respective said device regions upon application of a voltage therebetween.

* * * * *